(12) United States Patent
Seo et al.

(10) Patent No.: US 11,430,965 B2
(45) Date of Patent: Aug. 30, 2022

(54) ORGANIC LIGHT EMITTING DIODE AND ORGANIC LIGHT EMITTING DISPLAY DEVICE INCLUDING THE SAME

(71) Applicant: LG Display Co., Ltd., Seoul (KR)

(72) Inventors: Bo-Min Seo, Paju-si (KR); Kyung-Jin Yoon, Paju-si (KR); Joong-Hwan Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 333 days.

(21) Appl. No.: 16/701,611

(22) Filed: Dec. 3, 2019

(65) Prior Publication Data
US 2020/0194704 A1   Jun. 18, 2020

(30) Foreign Application Priority Data

Dec. 12, 2018 (KR) ........................ 10-2018-0159938

(51) Int. Cl.
*H01L 51/50* (2006.01)
*H01L 51/00* (2006.01)
*H01L 27/32* (2006.01)

(52) U.S. Cl.
CPC ........ *H01L 51/504* (2013.01); *H01L 51/0067* (2013.01); *H01L 51/0072* (2013.01);
(Continued)

(58) Field of Classification Search
None
See application file for complete search history.

(56) References Cited

U.S. PATENT DOCUMENTS

2006/0040132 A1   2/2006 Liao et al.
2011/0240971 A1   10/2011 Nowatari et al.
(Continued)

FOREIGN PATENT DOCUMENTS

CN   101447555 A   6/2009
CN   103050632 A   4/2013
(Continued)

OTHER PUBLICATIONS

First Examination Report dated Oct. 13, 2021, issued in corresponding Indian Patent Application No. 201914049653.
First Office Action dated Jul. 1, 2022, issued in corresponding Chinese Patent Application No. 201911176098.5.

*Primary Examiner* — Gregory D Clark
(74) *Attorney, Agent, or Firm* — Morgan, Lewis & Bockius LLP

(57) ABSTRACT

An organic light emitting diode includes a first electrode; a second electrode facing the first electrode; and an organic emitting layer between the first and second electrodes. The organic emitting layer includes a first emitting part between the first and second electrodes, a second emitting part between the first emitting part and the second electrode, and a charge generation layer between the first emitting part and the second emitting part. The charge generation layer includes an n-type charge generation layer between the first emitting part and the second emitting part, and a p-type charge generation layer between the n-type charge generation layer and the second emitting part. The p-type charge generation layer has a multi-layered structure, where an organic charge generation material layer and an inorganic charge generation material layer are alternately stacked.

20 Claims, 4 Drawing Sheets

(52) U.S. Cl.
CPC ...... *H01L 51/0073* (2013.01); *H01L 51/5004* (2013.01); *H01L 27/3244* (2013.01); *H01L 51/5056* (2013.01); *H01L 51/5072* (2013.01); *H01L 51/5088* (2013.01); *H01L 51/5092* (2013.01); *H01L 51/5096* (2013.01); *H01L 2251/303* (2013.01); *H01L 2251/5307* (2013.01); *H01L 2251/5315* (2013.01); *H01L 2251/552* (2013.01); *H01L 2251/558* (2013.01)

(56) References Cited

U.S. PATENT DOCUMENTS

| | | |
|---|---|---|
| 2013/0153867 A1 | 6/2013 | Seo et al. |
| 2014/0117338 A1* | 5/2014 | Cho .................. H01L 51/5278 257/40 |
| 2015/0144897 A1* | 5/2015 | Kang .................. H05B 33/14 257/40 |
| 2015/0155513 A1 | 6/2015 | Pieh et al. |

FOREIGN PATENT DOCUMENTS

| | | |
|---|---|---|
| CN | 103165818 A | 6/2013 |
| CN | 104681729 A | 6/2015 |
| EP | 3 151 301 A1 | 5/2017 |
| KR | 10-1926524 B1 | 12/2008 |

\* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATIONS

This application claims priority to and the benefit of Republic of Korea Patent Application No. 10-2018-0159938 filed in the Republic of Korea on Dec. 12, 2018, which is hereby incorporated by reference.

BACKGROUND

Technical Field

The present disclosure relates to an organic light emitting diode, and more particularly, to an organic light emitting diode (OLED) having high emitting efficiency and long lifespan and an organic light emitting display device including the same.

Description of the Related Art

Recently, requirement for flat panel display devices having small occupied area is increased. Among the flat panel display devices, a technology of an organic light emitting display device, which includes an OLED, is rapidly developed.

The OLED emits light by injecting electrons from a cathode as an electron injection electrode and holes from an anode as a hole injection electrode into an organic emitting layer, combining the electrons with the holes, generating an exciton, and transforming the exciton from an excited state to a ground state. A flexible transparent substrate, for example, a plastic substrate, can be used as a base substrate where elements are formed. In addition, the OLED can be operated at a voltage (e.g., 10V or below) lower than a voltage required to operate other display devices and has low power consumption. Moreover, the light from the OLED has excellent color purity.

The OLED may include a first electrode, which is formed over a substrate and acts as an anode, a second electrode, which faces the first electrode and acts as a cathode, and an organic emitting layer therebetween.

Recently, an organic light emitting display device, which includes an OLED, which emits white light in a red pixel, a green pixel and a blue pixel, and a color filter, is introduced. The light emitting diode may be called as a white organic light emitting diode (W-OLED).

The above W-OLED has a stack structure which includes at least two emitting parts. However, a driving voltage of the stack structure W-OLED is increased, and a lifespan of the stack structure W-OLED is decreased.

SUMMARY

Accordingly, embodiments of the present disclosure are directed to an organic light emitting diode and an organic light emitting display device including the same that substantially obviate one or more of the problems due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting diode comprises a first electrode; a second electrode facing the first electrode; and an organic emitting layer between the first and second electrodes, wherein the organic emitting layer includes a first emitting part between the first and second electrodes, a second emitting part between the first emitting part and the second electrode, and a charge generation layer between the first emitting part and the second emitting part; wherein the charge generation layer includes an n-type charge generation layer between the first emitting part and the second emitting part, and a p-type charge generation layer between the n-type charge generation layer and the second emitting part, and wherein the p-type charge generation layer has a multi-layered structure, where an organic charge generation material layer and an inorganic charge generation material layer are alternately stacked.

In another aspect, an organic light emitting diode comprises a first electrode; a second electrode facing the first electrode; and an organic emitting layer between the first and second electrodes; wherein the organic emitting layer includes a multi-stack structure comprising a plurality of emitting parts, and a charge generation layer between the adjacent emitting parts; wherein the charge generation layer includes an n-type charge generation layer and a p-type charge generation layer; wherein the p-type charge generation layer includes first and second layers and a third layer between the first and second layers, and wherein each of the first and second layers includes one of organic charge generation material and inorganic charge generation material, and the third layer includes the other one of organic charge generation material and inorganic charge generation material.

In another aspect, an organic light emitting display device comprises a substrate; and an organic light emitting diode over the substrate, the organic light emitting diode including: a first electrode; a second electrode facing the first electrode; and an organic emitting layer between the first and second electrodes, wherein the organic emitting layer includes a first emitting part between the first and second electrodes, a second emitting part between the first emitting part and the second electrode, and a charge generation layer between the first emitting part and the second emitting part; wherein the charge generation layer includes an n-type charge generation layer between the first emitting part and the second emitting part, and a p-type charge generation layer between the n-type charge generation layer and the second emitting part, and wherein the p-type charge generation layer has a multi-layered structure, where an organic charge generation material layer and an inorganic charge generation material layer are alternately stacked.

In another aspect, an organic light emitting display device comprises a substrate; and an organic light emitting diode over the substrate, the organic light emitting diode including: a first electrode; a second electrode facing the first electrode; and an organic emitting layer between the first and second electrodes; wherein the organic emitting layer includes a multi-stack structure comprising a plurality of emitting parts, and a charge generation layer between the adjacent emitting parts; wherein the charge generation layer includes an n-type charge generation layer and a p-type charge generation layer; wherein the p-type charge generation layer includes first and second layers and a third layer between the first and second layers, and wherein each of the first and second layers includes one of organic charge generation material and inorganic charge generation material, and the third layer includes the other one of organic charge generation material and inorganic charge generation material.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Reference will now be made in detail to embodiments of the disclosure, examples of which are illustrated in the accompanying drawings.

Figure 1:
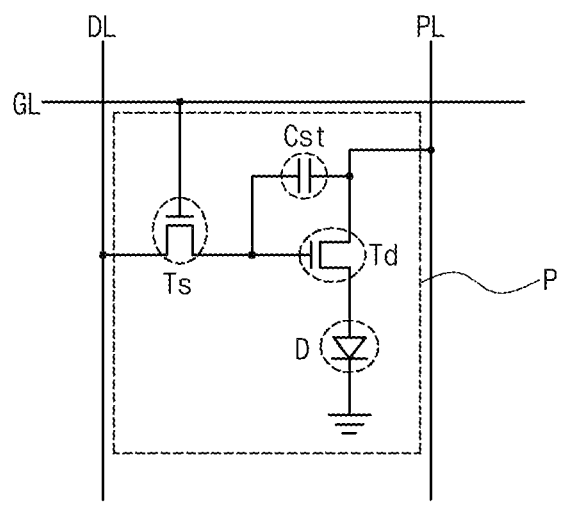
FIG. 1 is a schematic circuit diagram of an organic light emitting display device according to the present disclosure.

FIG. 1 is a schematic circuit diagram of an organic light emitting display device according to the present disclosure.

As shown in FIG. 1, in an organic light emitting display device, a gate line GL, a data line DL and a power line PL are formed, and a pixel region P is defined by the gate and data lines GL and DL. In the pixel region P, a switching thin film transistor (TFT) Ts, a driving TFT Td, a storage capacitor Cst and an organic light emitting diode (OLED) D are formed.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current is supplied to the OLED D from the power line PL through the driving TFT Td. As a result, the OLED D emits light. The storage capacitor Cst serves to maintain the voltage of the gate electrode of the driving TFT Td for one frame. Accordingly, the organic light emitting display device displays images.

Figure 2:
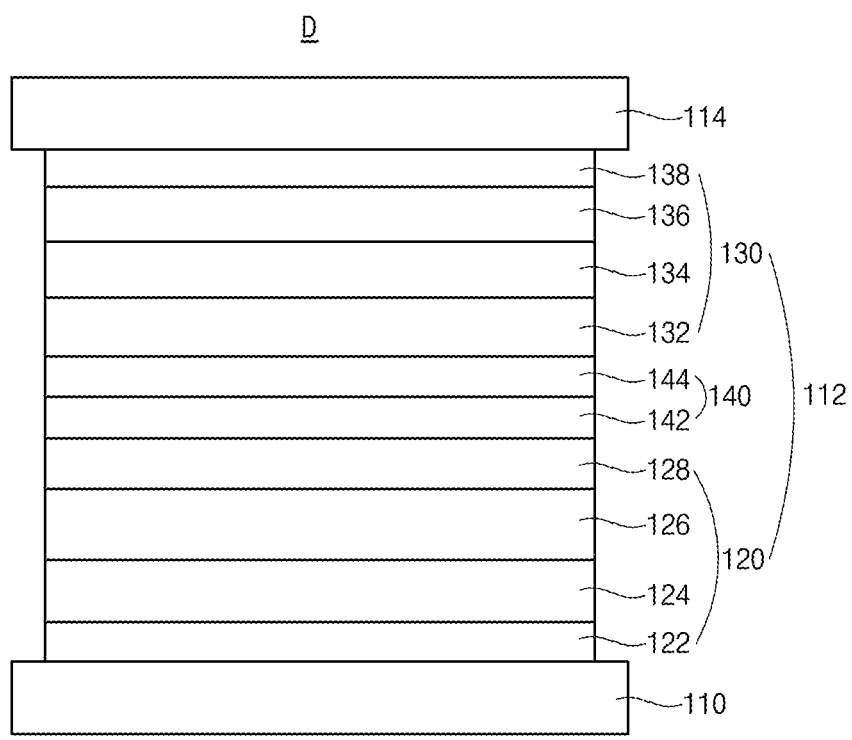
FIG. 2 is a schematic cross-sectional view of an OLED according to a first embodiment of the present disclosure.
Figure 3A:
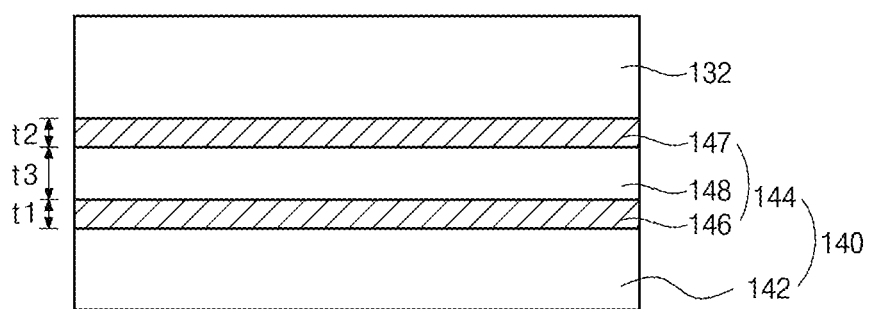
FIGS. 3A and 3B are schematic cross-sectional views illustrating a p-type charge generation layer, respectively.
Figure 3B:
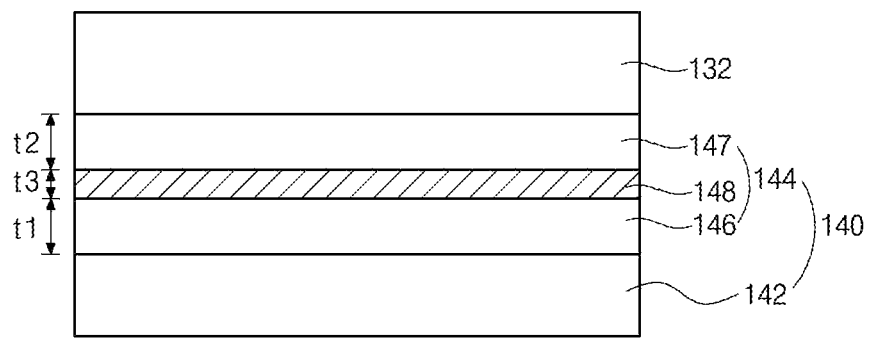

FIG. 2 is a schematic cross-sectional view of an OLED according to a first embodiment of the present disclosure, and FIGS. 3A and 3B are schematic cross-sectional views illustrating a p-type charge generation layer, respectively.

As shown in FIG. 2, the OLED D according to the first embodiment of the present disclosure includes a first electrode 110, a second electrode 114 facing the first electrode 110 and an organic emitting layer 112 between the first and second electrodes 110 and 114.

The first electrode 110 may include a conductive material having a relatively high work function to serve as an anode. For example, the first electrode 110 may be formed of a transparent conductive material such as indium-tin-oxide (ITO) or indium-zinc-oxide (IZO).

The second electrode 114 may cover a display area of an organic light emitting display device and may include a conductive material having a relatively low work function to serve as a cathode. For example, the second electrode 114 may be formed of aluminum (Al), magnesium (Mg) or Al—Mg alloy.

The light from the organic emitting layer 112 may be displayed through the first electrode 110. Namely, the OLED D may be a bottom-emission type.

Alternatively, the light from the organic emitting layer 112 may be displayed through the second electrode 114. Namely, the OLED D may be a top-emission type. In this instance, the second electrode 114 has a thin profile to have a semi-transparent property. In addition, a reflection electrode or a reflection layer may be formed under the first electrode 110. For example, the reflection electrode or the reflection layer may be formed of aluminum-palladium-copper (APC) alloy.

The organic emitting layer 112 includes a first emitting part 120 between the first and second electrodes 110 and 114, a second emitting part 130 between the first emitting part 120 and the second electrode 114 and a charge generation layer (CGL) 140 between the first emitting part 120 and the second emitting part 130. Namely, the organic emitting layer 112 has a multi-stack structure.

The CGL 140 is positioned between the first and second emitting parts 120 and 130 and provides an electron into the first emitting part 120 and a hole into the second emitting part 130.

The first emitting part 120 includes a first emitting material layer (EML) 126. For example, the first EML 126 may include a host and a blue dopant to emit blue light.

The first emitting part 120 may further include a hole injection layer (HIL) 122 between the first electrode 110 and the first EML 126, a first hole transporting layer (HTL) 124 between the HIL 122 and the first EML 126 and a first electron transporting layer 128 between the first EML 126 and the CGL 140. Namely, the first emitting part 120 may include the first EML 126, a first hole auxiliary layer between the first electrode 110 and the first EML 126 and including the HIL 122 and the first HTL 124 and a first electron auxiliary layer between the first EML 126 and the CGL 140 and including the first ETL 128.

Although not shown, the first emitting part 120 may further include an electron blocking layer between the first HTL 124 and the first EML 126 and a hole blocking layer between the first EML 126 and the first ETL 128.

The second emitting part 130 includes a second EML 134. The second EML 134 may include a host and a yellow-green dopant to emit yellow-green light.

Alternatively, the first EML 126 may emit yellow-green light, and the second EML 134 may emit blue light.

Accordingly, the blue light or the yellow-green light from the first emitting part 120 and the yellow-green light or the blue light from the second emitting part 130 are mixed such that the OLED emits white light.

The second emitting part 130 may further include a second HTL 132 between the CGL 140 and the second EML 134, a second ETL 136 between the second EML 134 and the second electrode 114 and an electron injection layer (EIL) 138 between the second ETL 136 and the second electrode 114. Namely, the second emitting part 130 may include the second EML 134, a second hole auxiliary layer between the CGL 140 and the second EML 134 and including the second HTL 132 and a second electron auxiliary layer between the second EML 134 and the second electrode 114 and including the second ETL 136 and the EIL 138.

A thickness of the first HTL 124 may be larger than that of the second HTL 132, and a thickness of the first ETL 128 may be smaller than that of the second ETL 136. For example, the first HTL 124 may have a thickness of about 500 to 1500 Å, and the second HTL 132 may have a thickness of about 100 to 300 Å. The first ETL 128 may have a thickness of about 100 to 300 Å, and the second ETL 136 may have a thickness of about 300 to 400 Å.

As a result, the electron injection property from the CGL 140 into the first emitting part 120 and the hole injection property from the CGL 140 into the second emitting part 130 are improved.

The CGL 140 includes an n-type CGL 142 between the first emitting part 120 and the second emitting part 130 and a p-type CGL 144 between the n-type CGL 142 and the second emitting part 130.

The p-type CGL 144 has a triple-layered structure including at least one layer, which is formed of an organic charge generation material, and at least one layer, which is formed of an inorganic charge generation material.

In more detail, the p-type CGL 144 includes first and second layers 146 and 147 and a third layer 148 between the first and second layers 146 and 147. Each of the first and second layers 146 and 147 includes one of the organic charge generation material and the inorganic charge generation material, and the third layer 148 includes the other one of the organic charge generation material and the inorganic charge generation material.

For example, the organic charge generation material may be HATCN compound. The HATCN compound may be represented by following chemical formula.

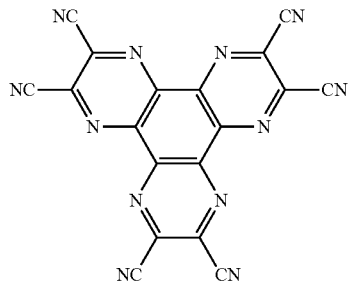 [SMILES: N#Cc1nc2c3nc(C#N)c(C#N)nc3c3nc(C#N)c(C#N)nc3c2nc1C#N]

The inorganic charge generation material may be a metal oxide and may have a conduction band level of about 4.0 to 7.5 eV. For example, the inorganic charge generation material may be one of $WO_3$, $MoO_3$, $Be_2O_3$ and $V_2O_5$.

As mentioned above, when the OLED D has the multi-stack structure to provide white light, the driving voltage of the OLED is increased. Accordingly, when the p-type CGL 144 is formed of only organic charge generation material, the organic charge generation material is thermally degraded such that the emitting efficiency and the lifespan of the OLED are decreased. Particularly, when the blue EML includes a delayed fluorescent dopant to increase the emitting efficiency, the thermal degradation problem of the organic charge generation material is strongly generated.

On the other hand, when the p-type CGL 144 is formed of only inorganic charge generation material to prevent the above problem, a color shift problem is generated such that the display quality of the OLED is decreased.

In the OLED of the present disclosure, the p-type CGL 144 has a multi-layered structure, where an organic charge generation material layer and an inorganic charge generation material layer are alternately stacked, both the thermal degradation problem by the organic charge generation material and the color shift problem by the inorganic charge generation material are prevented or minimized.

Referring to FIG. 3A, in the p-type CGL 144 between the n-type CGL 142 and the second HTL 132, each of the first and second layers 146 and 147 includes the organic charge generation material, and the third layer 148 includes the inorganic charge generation material.

For example, the organic charge generation material may be the HATCN compound, and the inorganic charge generation material may be the metal oxide, e.g., $WO_3$, $MoO_3$, $Be_2O_3$ or $V_2O_5$.

In the p-type CGL 144, the first and second layers 146 and 147 may have a first thickness t1 and a second thickness t2, respectively, and the third layer 148 may have a third thickness t3 being equal to or greater than each of the first thickness t1 and the second thickness t2.

For example, each of the first thickness t1 and the second thickness t2 may have a range of about 10 to 30 Å, and the third thickness t3 may have a range of about 30 to 80 Å.

The first and second layers 146 and 147 may include the same material or different material and may have the same thickness or different thicknesses.

Referring to FIG. 3B, in the p-type CGL 144 between the n-type CGL 142 and the second HTL 132, each of the first and second layers 146 and 147 includes the inorganic charge generation material, and the third layer 148 includes the organic charge generation material.

For example, the organic charge generation material may be the HATCN compound, and the inorganic charge generation material may be the metal oxide, e.g., $WO_3$, $MoO_3$, $Be_2O_3$ or $V_2O_5$.

In the p-type CGL 144, the first and second layers 146 and 147 may have a first thickness t1 and a second thickness t2, respectively, and the third layer 148 may have a third thickness t3 being equal to or smaller than each of the first thickness t1 and the second thickness t2.

For example, each of the first thickness t1 and the second thickness may have a range of about 30 to 80 Å, and the third thickness t3 may have a range of about 10 to 30 Å.

The first and second layers 146 and 147 may include the same material or different material and may have the same thickness or different thicknesses.

When the p-type CGL 144 includes the first and second layers 146 and 147, each of which includes one of the organic charge generation material and the inorganic charge generation material, and the third layer 148, which includes the other one of the organic charge generation material and the inorganic charge generation material and disposed between the first and second layer 146 and 147, the electron injection into the first EML 126, which may include a delayed fluorescent host and a delayed fluorescent dopant to serve as a blue EML, is too rich such that a problem of transporting the electron into the first HTL 124 may be generated.

To prevent the above problem, an electron blocking layer (EBL) including an electron blocking material may be formed between the first EML 126 and the first HTL 124. In this instance, a difference of a HOMO level of the delayed fluorescent host ($HOMO_{TH}$) and a HOMO level of the electron blocking material ($HOMO_{EBM}$) may be smaller than 0.3 eV, and a difference of an LUMO level of the delayed fluorescent host ($LUMO_{TH}$) and an LUMO level of the electron blocking material ($LUMO_{EBM}$) may be equal to or greater than 0.3 eV. ($|HOMO_{TH}-HOMO_{EBM}|<0.3$ eV, $|LUMO_{TH}-LUMO_{EBM}|\geq 0.3$ eV)

As a result, the transport (or injection) of the electron into the first HTL 124 is prevented.

For example, the delayed fluorescent host may be represented by Formula 1.

[Formula 1]

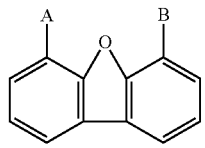

In Formula 1, each of A and B is independently selected from the group consisting of substituted or non-substituted dibenzofuranyl, substituted or non-substituted dibenzofuranyl phenyl, substituted or non-substituted carbazolyl and substituted or non-substituted carbazolyl phenyl. The substituent may be a cyano group.

For example, at least one of A and B may be substituted or non-substituted dibenzofuranyl. Namely, in the delayed fluorescent host, a dibenzofuranyl substituent is bonded (combined) to at least one of a 4$^{th}$ position or a 6$^{th}$ position of the dibenzofuran core.

The delayed fluorescent dopant may be selected from compounds in Formula 2.

[Formula 2]

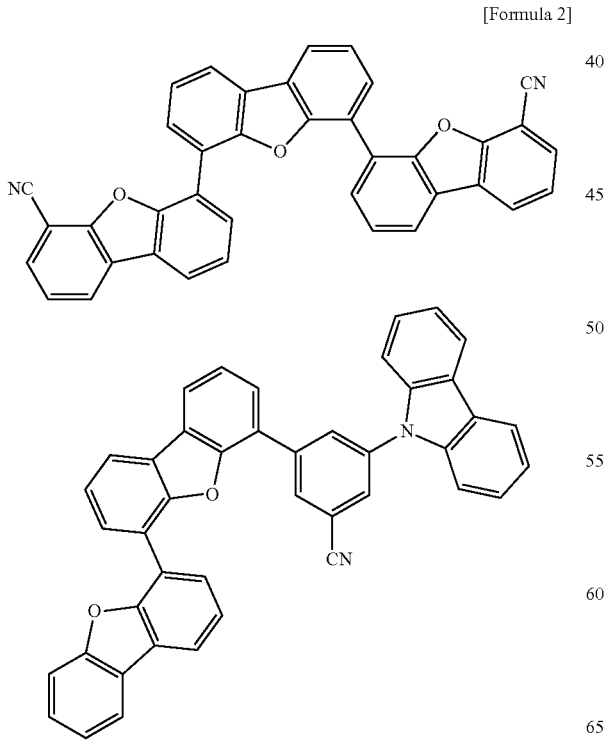

The electron blocking material may be represented by Formula 3.

[Formula 3]

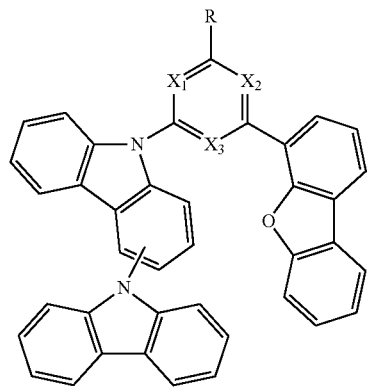

In Formula 3, each of $X_1$ to $X_3$ is selected from carbon and nitrogen, and at least one of $X_1$ to $X_3$ is nitrogen. For example, two of $X_1$ to $X_3$ may be nitrogen. R is C6 to C30 aryl group.

The electron blocking material may be selected from compounds in Formula 4.

[Formula 4]

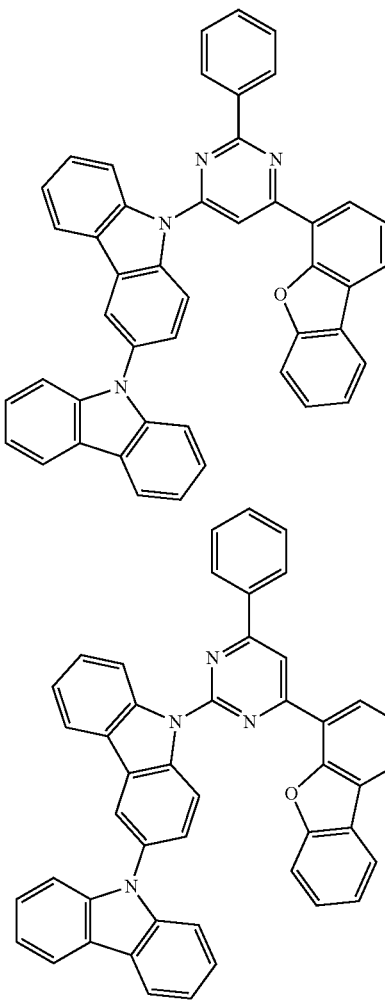

To prevent the exciton generated in the first EML 126 being transported into the electron blocking layer, an energy level of triplet state of the delayed fluorescent host ($T1_{TH}$) may be equal to or greater than an energy level of triplet state of the delayed fluorescent dopant ($T1_{TD}$) and may be equal to or smaller than an energy level of triplet state of the electron blocking material ($T1_{EBL}$). ($T1_{TD} \leq T1_{TH} \leq T1_{EBL}$) For example, the energy level of triplet state of the delayed fluorescent host ($T1_{TH}$) may be greater than the energy level of triplet state of the delayed fluorescent dopant ($T1_{TD}$) and may be smaller than the energy level of triplet state of the electron blocking material ($T1_{EBL}$).

In FIG. 2, the OLED D has a double-stack structure including the first emitting part 120 emitting blue light and the second emitting part 130 emitting yellow-green light. Alternatively, the OLED D may has a triple-stack structure including a first emitting part emitting blue light, a second emitting part emitting green light and a third emitting part emitting red light.

[Organic Light Emitting Diode]

On an ITO layer (anode), (a) HIL (HATCN, 50 Å), (b) first HTL (α-NPB (Formula 5), 500 Å), (c) EBL (TCTA (Formula 6), 100 Å), (d) blue EML (host (Formula 7): dopant (Formula 8, 30 wt %), 250 Å), (e) HBL (Formula 9, 100 Å), (f) first ETL (Formula 10, 100 Å), (g) n-type CGL (bephene (Formula 11): Li (2 wt %), 100 Å), (h) p-type CGL (100 Å), (i) second HTL (α-NPB, 100 Å), (j) yellow-green EML (host (Formula 12): dopant (Formula 13, 5 wt %), 300 Å), (k) second ETL (Formula 10, 300 Å), (l) EIL (LiF, 5 Å), and (m) cathode (Al, 800 Å) are sequentially formed.

[Formula 5]

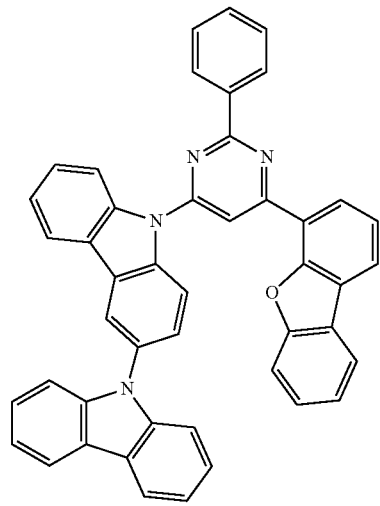

[Formula 6]

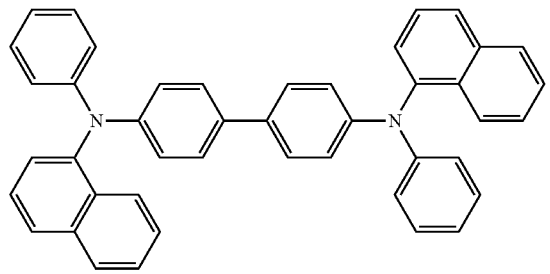

[Formula 7]

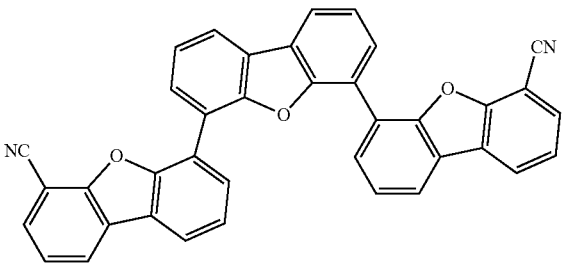

[Formula 8]

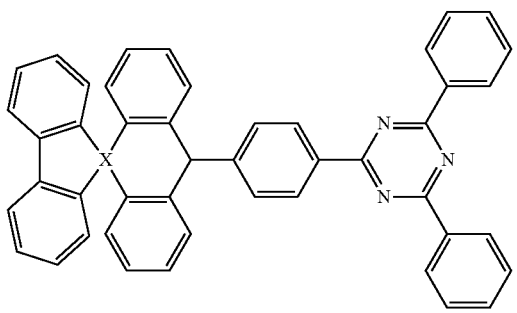

(X is carbon)

[Formula 9]

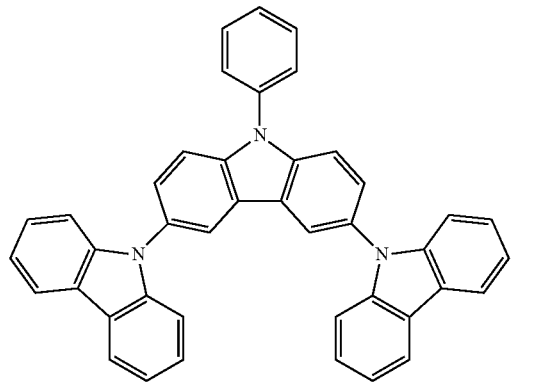

[Formula 10]

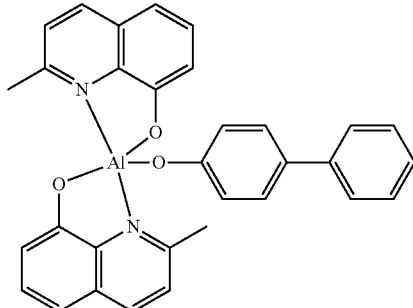

[Formula 11]

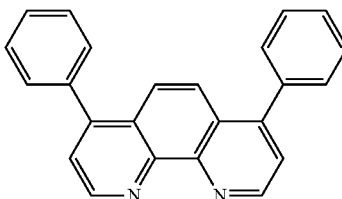

-continued

[Formula 12]

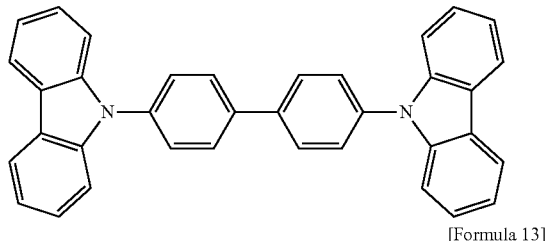

[Formula 13]

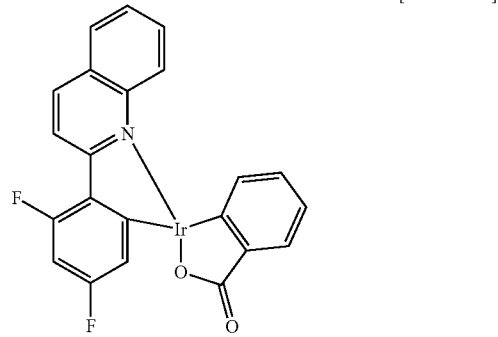

(1) Comparative Example (Ref)

HATCN compound is used to form the p-type CGL.

(2) Example 1 (Ex1)

A first layer (HATCN), a second layer ($WO_3$) and a third layer (HATCN) are sequentially stacked to form the p-type CGL. (thickness ratio=1:1:1)

(3) Example 2 (Ex2)

A first layer (HATCN), a second layer ($WO_3$) and a third layer (HATCN) are sequentially stacked to form the p-type CGL. (thickness ratio=1:2:1)

(4) Example 3 (Ex3)

A first layer (HATCN), a second layer ($WO_3$) and a third layer (HATCN) are sequentially stacked to form the p-type CGL. (thickness ratio=1:4:1)

(5) Example 4 (Ex4)

A first layer (HATCN), a second layer ($WO_3$) and a third layer (HATCN) are sequentially stacked to form the p-type CGL. (thickness ratio=1:0.5:1)

(6) Example 5 (Ex5)

A first layer ($WO_3$), a second layer (HATCN) and a third layer ($WO_3$) are sequentially stacked to form the p-type CGL. (thickness ratio=1:1:1)

(7) Example 6 (Ex6)

A first layer ($WO_3$), a second layer (HATCN) and a third layer ($WO_3$) are sequentially stacked to form the p-type CGL. (thickness ratio=1:2:1)

(8) Example 7 (Ex7)

A first layer ($WO_3$), a second layer (HATCN) and a third layer ($WO_3$) are sequentially stacked to form the p-type CGL. (thickness ratio=1:4:1)

(9) Example 8 (Ex8)

A first layer ($WO_3$), a second layer (HATCN) and a third layer ($WO_3$) are sequentially stacked to form the p-type CGL. (thickness ratio=1:0.5:1)

The properties of the OLED in Comparative Example and Examples 1 to 8 are measured and listed in Table 1.

TABLE 1

|  | Voltage | Cd/A | EQE | CIEx, CIEy | LIFESPAN |
| --- | --- | --- | --- | --- | --- |
| Ref | 9.2 | 53.0 | 22.7 | 0.311, 0.349 | 1 |
| Ex1 | 9.0 | 51.2 | 21.1 | 0.321, 0.379 | 1.1 |
| Ex2 | 8.8 | 53.1 | 22.9 | 0.329, 0.380 | 1.2 |
| Ex3 | 8.2 | 56.2 | 27.9 | 0.331, 0.352 | 1.4 |
| Ex4 | 9.1 | 51.7 | 21.7 | 0.323, 0.369 | 1.07 |
| Ex5 | 8.1 | 58.9 | 28.9 | 0.322, 0.338 | 2.2 |
| Ex6 | 8.3 | 56.2 | 21.7 | 0.322, 0.375 | 1.9 |
| Ex7 | 8.6 | 51.5 | 20.2 | 0.381, 0.399 | 1.7 |
| Ex8 | 8.0 | 59.2 | 28.7 | 0.322, 0.368 | 2.2 |

As shown in Table 1, when the p-type CGL in the OLED has the HATCN/$WO_3$/HATCN structure or the $WO_3$/HATCN/$WO_3$ structure, the brightness, the emitting efficiency and the lifespan of the OLED are improved.

In addition, as shown in Examples 1 to 3, Example 5 and Example 8, when the $WO_3$ layer has a thickness being equal to or greater than the HATCN layer, the emitting efficiency and the lifespan of the OLED are further improved. The thickness of the $WO_3$ layer may be greater than that of the HATCN layer.

Figure 4:
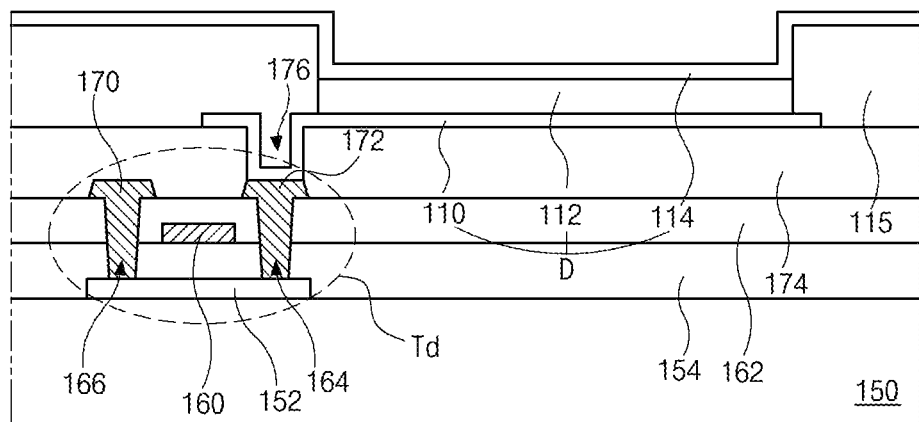
FIG. 4 is a schematic cross-sectional view of an organic light emitting display device according to a second embodiment of the present disclosure.

FIG. 4 is a schematic cross-sectional view of an organic light emitting display device according to a second embodiment of the present disclosure.

As shown in FIG. 4, the organic light emitting display device 100 includes a substrate 150, a thin film transistor (TFT) Td on the substrate 150 and the OLED D connected to the TFT Td.

The substrate 150 may be a glass substrate or a flexible substrate of polyimide. The substrate 150 may have a flexible property.

Although not shown, a buffer layer of an inorganic material, e.g., silicon oxide or silicon nitride, may be formed on the substrate 150.

The TFT Td is connected to the switching TFT Ts (of FIG. 1) and includes a semiconductor layer 152, a gate electrode 160, a source electrode 170 and a drain electrode 172.

The semiconductor layer 152 is formed on the substrate 150. The semiconductor layer 152 may be formed of an oxide semiconductor material or a poly-silicon.

When the semiconductor layer 152 includes the oxide semiconductor material, a light-shielding pattern (not shown) may be formed under the semiconductor layer 152. The light to the semiconductor layer 152 is shielded or blocked by the light-shielding pattern such that thermal degradation of the semiconductor layer 152 can be prevented. On the other hand, when the semiconductor layer 152 includes polycrystalline silicon, impurities may be doped into both sides of the semiconductor layer 152.

A gate insulating layer 154 is formed on the semiconductor layer 152. The gate insulating layer 154 may be formed of an inorganic insulating material such as silicon oxide or silicon nitride.

A gate electrode 160, which is formed of a conductive material, e.g., metal, is formed on the gate insulating layer 154 to correspond to a center of the semiconductor layer 152. The gate electrode 160 is connected to the switching TFT Ts.

The gate insulating layer 154 is formed on the entire surface of the substrate 150. Alternatively, the gate insulating layer 154 may be patterned to have the same shape as the gate electrode 160.

An interlayer insulating layer 162, which is formed of an insulating material, is formed on an entire surface of the substrate 150 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 166 and 164 exposing both sides of the semiconductor layer 152. The first and second contact holes 166 and 164 are positioned at both sides of the gate electrode 160 to be spaced apart from the gate electrode 160.

The first and second contact holes 166 and 164 extend into the gate insulating layer 154. Alternatively, when the gate insulating layer 154 is patterned to have the same shape as the gate electrode 160, there may be no first and second contact holes 166 and 164 in the gate insulating layer 154.

A source electrode 170 and a drain electrode 172, which are formed of a conductive material, e.g., metal, are formed on the interlayer insulating layer 162. The source electrode 170 and the drain electrode 172 are spaced apart from each other with respect to the gate electrode 160 and respectively contact both sides of the semiconductor layer 152 through the first and second contact holes 166 and 164. The source electrode 170 is connected to the power line PL (FIG. 1).

The TFT Td including the semiconductor layer 152, the gate electrode 160, the source electrode 170 and the drain electrode 172 serves as a driving element.

The gate electrode 160, the source electrode 170 and the drain electrode 172 are positioned over the semiconductor layer 152. Namely, the TFT Td has a coplanar structure.

Alternatively, in the TFT Td, the gate electrode may be positioned under the semiconductor layer, and the source and drain electrodes may be positioned over the semiconductor layer such that the TFT Td may have an inverted staggered structure. In this instance, the semiconductor layer may include amorphous silicon.

On the other hand, the switching TFT Ts may have substantially same structure as the TFT Td.

A passivation layer 174, which includes a drain contact hole 176 exposing the drain electrode 172 of the TFT Td, is formed to cover the TFT Td.

The OLED D including the first electrode 110, the organic emitting layer 112 and the second electrode 114 is formed on the passivation layer 174 and over the substrate 150.

The first electrode 110, which is connected to the drain electrode 172 of the TFT Td through the drain contact hole 176, is separately formed on the passivation layer 174 in each pixel region. The first electrode 110 may be an anode and may be formed of a conductive material having a relatively high work function. For example, the first electrode 110 may be formed of a transparent conductive material such as indium-tin-oxide (ITO) or indium-zinc-oxide (IZO).

A bank layer 115, which covers edges of the first electrode 110, is formed on the passivation layer 174. The bank 115 exposes a center of the first electrode 110 in the pixel region.

The organic emitting layer 112 is formed on the first electrode 110.

Referring to FIGS. 2, 3A and 3B, the organic emitting layer 112 includes the first emitting part 120 between the first and second electrodes 110 and 114, the second emitting part 130 between the first emitting part 120 and the second electrode 114 and the CGL 140 between the first and second emitting parts 120 and 130. Namely, the organic emitting layer 112 has a multi-stack structure.

The CGL 140 includes the n-type CGL 142 and the p-type CGL 144, and the p-type CGL 144 includes the first and second layers 146 and 147, each of which includes one of the organic charge generation material and the inorganic charge generation material, and the third layer 148, which includes the other one of the organic charge generation material and the inorganic charge generation material.

The second electrode 114 is formed over the substrate 150 including the organic emitting layer 112. The second electrode 114 is positioned at an entire surface of the display area. The second electrode 114 may be a cathode and may be formed of a conductive material having a relatively low work function. For example, the second electrode 114 may be formed of aluminum (Al), magnesium (Mg) or Al—Mg alloy.

Although not shown, a polarization plate preventing an ambient light reflection may be disposed over the OLED D or under the substrate 150. For example, the polarization plate may be a circular polarization plate.

Figure 5:
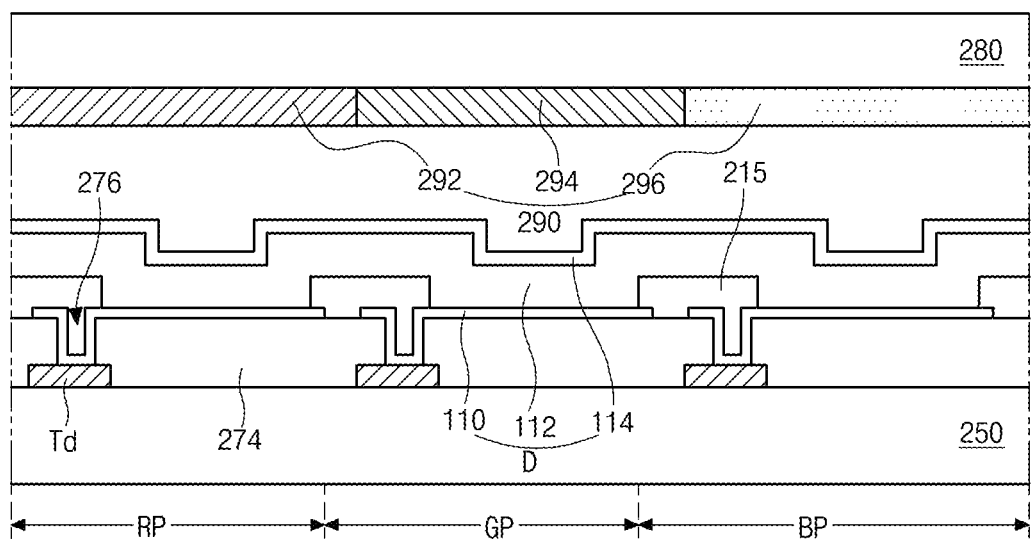
FIG. 5 is a schematic cross-sectional view of an organic light emitting display device according to a third embodiment of the present disclosure.

FIG. 5 is a schematic cross-sectional view of an organic light emitting display device according to a third embodiment of the present disclosure.

As shown in FIG. 5, the organic light emitting display device 200 includes a first substrate 250, where a red pixel RP, a green pixel GP and a blue pixel BP are defined, a second substrate 280 facing the first substrate 250, the OLED D, which is positioned between the first and second substrates 250 and 280 and emits white light, and a color filter layer 290 between the OLED D and the second substrate 280.

Each of the first and second substrates 250 and 280 may be a glass substrate or a flexible substrate of polyimide. Each of the first and second substrates 250 and 280 may have a flexible property.

The TFT Td as the driving element is formed in each of the red, green and blue pixels RP, GP and BP.

For example, as shown in FIG. 4, the TFT Td may include the semiconductor layer 152, the gate electrode 160, the source electrode 170 and the drain electrode 172. The gate electrode 160, the source electrode 170 and the drain electrode 172 may be positioned over the semiconductor layer 152 such that the TFT Td may have a coplanar structure.

The passivation layer 274 including the drain contact hole 276, which exposes an electrode, e.g., the drain electrode, of the TFT Td is formed to cover the TFT Td.

The OLED D is positioned on the passivation layer 274 and includes the first electrode 110, the second electrode 114 and the organic emitting layer 112.

The first electrode 112 is separately formed in each of the red, green and blue pixels RP, GP and BP. The first electrode 110 may be an anode and may be formed of a conductive material having a relatively high work function. For example, the first electrode 110 may be formed of a transparent conductive material such as indium-tin-oxide (ITO) or indium-zinc-oxide (IZO).

When the OLED device 200 is operated in a top-emission type, a reflection electrode or a reflection layer may be formed under the first electrode 110. For example, the reflection electrode or the reflection layer may be formed of aluminum-palladium-copper (APC) alloy.

The bank layer 215, which covers edges of the first electrode 110, is formed on the passivation layer 274. The bank 215 exposes a center of the first electrode 110.

The organic emitting layer 112 is formed on the first electrode 110.

Referring to FIGS. 2, 3A and 3B, the organic emitting layer 112 includes the first emitting part 120 between the first and second electrodes 110 and 114, the second emitting part 130 between the first emitting part 120 and the second electrode 114 and the CGL 140 between the first and second emitting parts 120 and 130. Namely, the organic emitting layer 112 has a multi-stack structure.

The CGL 140 includes the n-type CGL 142 and the p-type CGL 144, and the p-type CGL 144 includes the first and second layers 146 and 147, each of which includes one of the organic charge generation material and the inorganic charge generation material, and the third layer 148, which includes the other one of the organic charge generation material and the inorganic charge generation material.

The organic layer 112 may be formed to cover an entire surface of the red, green and blue pixels RP, GP and BP. In this instance, the bank layer 215 may be omitted.

The second electrode 114 is formed over the first substrate 250 including the organic emitting layer 112. The second electrode 114 is positioned at an entire surface of the display area. The second electrode 114 may be a cathode and may be formed of a conductive material having a relatively low work function. For example, the second electrode 114 may be formed of aluminum (Al), magnesium (Mg) or Al—Mg alloy.

In the organic light emitting display device 200, since the light from the organic emitting layer 112 is incident to the color filter layer 290 through the second electrode 114, the second electrode 114 has a thin profile such that the light passes through the second electrode 114 (semitransparent).

The color filter layer 290 is positioned over the OLED D and includes a red color filter 292, a green color filter 294 and a blue color filter 296 respectively corresponding to the red pixel RP, the green pixel GP and the blue pixel BP.

Although not shown, the color filter layer 290 may be attached to the OLED D using an adhesive layer. Alternatively, the color filter layer 290 may be directly formed on the OLED D.

Although not shown, a polarization plate preventing an ambient light reflection may be disposed at an outer side of the second substrate 280. For example, the polarization plate may be a circular polarization plate.

In FIG. 5, the light from the OLED D passes through the second electrode 114, and the color filter layer 290 is disposed over the OLED D. Alternatively, when the light from the OLED D passes through the first electrode 110, the color filter layer 290 may be disposed between the OLED D and the first substrate 250.

In addition, a color conversion layer (not shown) may be formed instead of the color filter layer 290 or between the color filter layer 290 and the OLED D.

It will be apparent to those skilled in the art that various modifications and variations can be made in the organic light emitting diode and the organic light emitting display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting diode, comprising:
   a first electrode;
   a second electrode facing the first electrode; and
   an organic emitting layer between the first and second electrodes,
   wherein the organic emitting layer includes a first emitting part between the first and second electrodes, a second emitting part between the first emitting part and the second electrode, and a charge generation layer between the first emitting part and the second emitting part,
   wherein the charge generation layer includes an n-type charge generation layer between the first emitting part and the second emitting part, and a p-type charge generation layer between the n-type charge generation layer and the second emitting part, and
   wherein the p-type charge generation layer has a multi-layered structure, where an organic charge generation material layer and an inorganic charge generation material layer are alternately stacked.

2. The organic light emitting diode according to claim 1, wherein the p-type charge generation layer includes first and second layers and a third layer between the first and second layers; and
   wherein each of the first and second layers is the organic charge generation material layer, and the third layer is the inorganic charge generation material layer.

3. The organic light emitting diode according to claim 2, wherein the first and second layers have a first thickness and a second thickness, respectively, and the third layer has a third thickness being equal to or greater than each of the first thickness and the second thickness.

4. The organic light emitting diode according to claim 3, wherein each of the first thickness and the second thickness is 10 to 30 Å, and the third thickness is 30 to 80 Å.

5. The organic light emitting diode according to claim 2, wherein the first and second layers include same material or different material and have same thickness or different thicknesses.

6. The organic light emitting diode according to claim 1, wherein the p-type charge generation layer includes first and second layers and a third layer between the first and second layers, and
   wherein each of the first and second layers is the inorganic charge generation material layer, and the third layer is the organic charge generation material layer.

7. The organic light emitting diode according to claim 6, wherein the first and second layers have a first thickness and a second thickness, respectively, and the third layer has a third thickness being equal to or smaller than each of the first thickness and the second thickness.

8. The organic light emitting diode according to claim 7, wherein each of the first thickness and the second thickness is 30 to 80 Å, and the third thickness is 10 to 30 Å.

9. The organic light emitting diode according to claim 6, wherein the first and second layers include same material or different material and have same thickness or different thicknesses.

10. The organic light emitting diode according to claim 1, wherein the inorganic charge generation material layer includes a metal oxide having a conduction band level of about 4.0 to 7.5 eV.

11. The organic light emitting diode according to claim 10, wherein the metal oxide is $WO_3$, $MoO_3$, $Be_2O_3$ or $V_2O_5$.

12. The organic light emitting diode according to claim 1, wherein the first emitting part includes a first hole transporting layer and a first electron transporting layer, and the second emitting part includes a second hole transporting layer and a second electron transporting layer, and
wherein a thickness of the first hole transporting layer is larger than that of the second hole transporting layer, and a thickness of the first electron transporting layer is smaller than that of the second electron transporting layer.

13. The organic light emitting diode according to claim 1, wherein the first emitting part includes a first emitting material layer including a host, and
wherein the host is a delayed fluorescent host.

14. The organic light emitting diode according to claim 13,
wherein the first emitting part further includes a hole auxiliary layer between the first electrode and the first emitting material layer, and
wherein the first emitting part further includes an electron blocking layer between the hole auxiliary layer and the first emitting material layer, the electron blocking layer includes an electron blocking material.

15. The organic light emitting diode according to claim 14, wherein a difference of a HOMO level of the host and a HOMO level of the electron blocking material is smaller than 0.3 eV, and a difference of an LUMO level of the host and an LUMO level of the electron blocking material is equal to or greater than 0.3 eV.

16. The organic light emitting diode according to claim 14, wherein a triplet energy of the host is equal to or smaller than a triplet energy of the electron blocking material.

17. The organic light emitting diode according to claim 14,
wherein the host is represented by Formula 1:

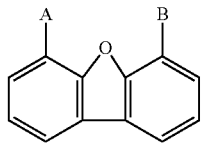

[Formula 1]

wherein in Formula 1, each of A and B is independently selected from the group consisting of substituted or non-substituted dibenzofuranyl, substituted or non-substituted dibenzofuranyl phenyl, substituted or non-substituted carbazolyl and substituted or non-substituted carbazolyl phenyl,
wherein the electron blocking material is represented by Formula 3:

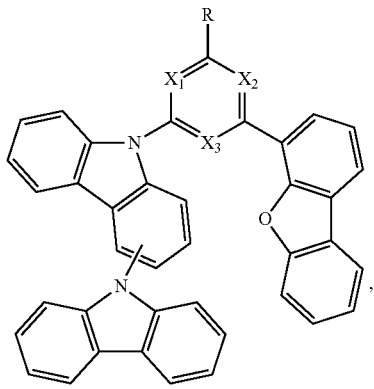

[Formula 3]

and
wherein in Formula 3, each of $X_1$ to $X_3$ is selected from carbon and nitrogen, and at least one of $X_1$ to $X_3$ is nitrogen; and R is C6 to C30 aryl group.

18. An organic light emitting diode, comprising:
a first electrode;
a second electrode facing the first electrode; and
an organic emitting layer between the first and second electrodes,
wherein the organic emitting layer includes a multi-stack structure comprising a plurality of emitting parts, and a charge generation layer between the adjacent emitting parts;
wherein the charge generation layer includes an n-type charge generation layer and a p-type charge generation layer;
wherein the p-type charge generation layer includes first and second layers and a third layer between the first and second layers, and
wherein each of the first and second layers includes one of organic charge generation material and inorganic charge generation material, and the third layer includes the other one of organic charge generation material and inorganic charge generation material.

19. An organic light emitting display device, comprising:
a substrate; and
an organic light emitting diode over the substrate, the organic light emitting diode including:
a first electrode;
a second electrode facing the first electrode; and
an organic emitting layer between the first and second electrodes,
wherein the organic emitting layer includes a first emitting part between the first and second electrodes, a second emitting part between the first emitting part and the second electrode, and a charge generation layer between the first emitting part and the second emitting part;
wherein the charge generation layer includes an n-type charge generation layer between the first emitting part and the second emitting part, and a p-type charge generation layer between the n-type charge generation layer and the second emitting part;
wherein the p-type charge generation layer has a multi-layered structure, where an organic charge generation material layer and an inorganic charge generation material layer are alternately stacked.

20. An organic light emitting display device, comprising:
a substrate; and
an organic light emitting diode over the substrate, the organic light emitting diode including:
a first electrode;
a second electrode facing the first electrode; and
an organic emitting layer between the first and second electrodes,
wherein the organic emitting layer includes a multi-stack structure comprising a plurality of emitting parts, and a charge generation layer between the adjacent emitting parts;
wherein the charge generation layer includes an n-type charge generation layer and a p-type charge generation layer;
wherein the p-type charge generation layer includes first and second layers and a third layer between the first and second layers, and
wherein each of the first and second layers includes one of organic charge generation material and inorganic charge generation material, and the third layer includes the other one of organic charge generation material and inorganic charge generation material.

\* \* \* \* \*